United States Patent [19]

Beyer et al.

[11] Patent Number: 4,758,531

[45] Date of Patent: Jul. 19, 1988

[54] METHOD OF MAKING DEFECT FREE SILICON ISLANDS USING SEG

[75] Inventors: Klaus D. Beyer, Poughkeepsie; Louis L. Hsu, Fishkill; Dominic J. Schepis, Wappingers Falls; Victor J. Silvestri, Hopewell Junction, all of N.Y.

[73] Assignee: International Business Machines Corporation, Armonk, Nebr.W YORK

[21] Appl. No.: 111,888

[22] Filed: Oct. 23, 1987

[51] Int. Cl.[4] .................. H01L 21/205; H01L 21/76
[52] U.S. Cl. ........................ 437/90; 437/67; 437/103; 437/239; 148/DIG. 26; 148/DIG. 29; 148/DIG. 97; 156/610; 156/613; 156/612; 156/644
[58] Field of Search ............... 148/DIG. 26, 29, 97, 148/127; 437/67, 90, 103, 239, 241, 228, 89; 156/610–614, 644, 662

[56] References Cited

U.S. PATENT DOCUMENTS

| 4,349,394 | 9/1982 | Wei ............................ 437/89 |
| 4,497,683 | 2/1985 | Celler et al. .................. 437/89 |
| 4,547,231 | 10/1985 | Hine .......................... 156/612 |
| 4,578,142 | 3/1986 | Corboy, Jr. et al. ............ 156/610 |
| 4,579,621 | 4/1986 | Hine .......................... 156/644 |
| 4,637,127 | 1/1987 | Kurogi et al. ................. 437/89 |

FOREIGN PATENT DOCUMENTS

| 0123143 | 9/1980 | Japan ........................ 437/90 |
| 0168260 | 10/1983 | Japan ....................... 437/89 |
| 0134819 | 8/1984 | Japan ........................ 437/90 |
| 0167014 | 9/1984 | Japan ........................ 437/90 |
| 0192322 | 9/1985 | Japan ........................ 437/90 |
| 0182220 | 8/1986 | Japan ........................ 437/89 |

OTHER PUBLICATIONS

Tanno et al., "Selective Silicon Epitaxy Using Reduced Pressure Technique", Jap. J. Appl. Phys. vol. 21, No. 9, Sep., 1982, pp. L564–L566.

Ishitani et al., "Facet Formation in Selective Silican Epitaxial Growth", Jap. J. Appl. Phys., vol. 24, No. 10, Oct. 1985, pp. 1267–1269.

Liaw et al., "Epitaxial Silicon for Bipolar Integrated Circuits", Solid State Technology, May, 1984, pp. 135–143.

Borland et al., "Advanced Dielectric Isolation Through Selective Epitaxial Growth Techniques", Solid State Technology, Aug., 1985, pp. 141–148.

Endo et al., "Novel Device Isolation Technology with Selective Epitaxial Growth", IEEE Trans Elect. Devices, vol. ED-31, No. 9, Sep., 1984, pp. 1283–1288.

Primary Examiner—Brian E. Hearn
Assistant Examiner—William Brench

[57] ABSTRACT

A method for forming epitaxial grown silicon structure having substantially defect free outer surfaces and resulting structure is provided. A silicon substrate is provided, on which an epitaxial silicon crystal is grown. The outer surface layer of the silicon epitaxially grown silicon crystal will contain defective material which is removed by oxidation of the outer layer to silicon dioxide. This removes the defect containing outer layer, creating a new outer layer which is substantially defect free.

16 Claims, 5 Drawing Sheets

METHOD OF MAKING DEFECT FREE SILICON ISLANDS USING SEG

FIELD OF THE INVENTION

This invention relates generally to a method of manufacturing integrated semiconductor devices and isolation structures and more particularly to forming low defect or defect free semiconductors in selectively epitaxially grown semiconductor crystal regions. In more particular aspects, this invention is particularly useful in forming densely packed isolation device structures which allow use of both semiconductor substrate and selectively grown semiconductor regions for forming active devices and circuits. The elimination of defects in the selectively epitaxially grown silicon crystal is required in semiconductor technology to advance the state-of-the-art in reducing the size of isolation structures such as trenches as described in much of the prior art. This invention has wide application in semiconductor technology wherein low defect or defect free semiconductors are required in the regions abutting the insulators to form high performance active diode and MOS device structures in such regions.

DESCRIPTION OF THE PRIOR ART

In monolithic integrated circuit technology, it is necessary to isolate various elements from one another within the circuit structure. Although several different techniques for such isolation have been used, the preferred form is some type of dielectric isolation, which is accomplished by the use of dielectric materials such as silicon dioxide, silicon nitride, and the like. As indicated above, one of the principal uses for epitaxially grown silicon is in the trench isolation process. A technique for growing epitaxial silicon crystals in the trench isolation process is described in detail in U.S. Pat. No. 4,526,631 to Silvestri et al. assigned to the same assignee as the present invention and in the numerous references cited therein. In this patent Silvestri et al. teach the formation of trenches in a monocrystalline silicon substrate. A layer of insulating material such as silicon dioxide and silicon nitride is formed on the side walls to provide the isolation required between adjacent active regions where devices are formed. The bottom of the trenches are exposed substrate monocrystalline silicon material, which as described may be suitably doped with P or N type material.

A monocrystalline silicon material can be selectively grown on the substrate within the isolated trenches with suitable dopants being added to the epitaxial silicon as it is being grown. In the above invention, the selectively grown material is advantageous in forming a void free refill for an isolation trench. This selectively grown silicon could be used to even greater advantage in increasing packing density if defect free silicon could be formed within the selective epitaxial crystals. For example, the selectively grown silicon and the substrate silicon could be used for device fabrication and the intervening insulators employed for isolation purposes. The prior art has shown that defects form along the sidewalls of the insulators during the selective epitaxial growth and that these defects have severely curtailed the full utilization of the selective silicon material. The defects formed at this interface result in device leakage and low performance. The present invention eliminates these sidewall defects and provides the basis for full utilization of such regions. The doped epitaxial silicon crystals as well as the silicon substrate material provide the basis for forming the various semiconductor devices useful in various semiconductor technologies such as Bipolar, MOSFET, CMOS, NMOS, etc., the dielectric material of the trench side walls acting as insulating material to separate the epitaxial silicon from the adjacent silicon which also may be used to form semiconductor devices.

This same technique of growing selective epitaxial silicon crystals can be used to provide epitaxial growth of monocrystalline silicon on the surface of a monocrystalline silicon substrate with the selective epitaxial regions being separated by a dielectric layer formed on the surface of the substrate. The insulators are initially patterned by standard resist techniques to provide regions of openings through the dielectric to the substrate. The selectively grown epitaxial silicon regions are then separated by the boundaries of the dielectric material, which again may be a layer of silicon dioxide or a composite layer of silicon dioxide and silicon nitride.

The selective epitaxial techniques for forming this type of selective epitaxial silicon are also described in U.S. Pat. No. 4,473,598 to Ephrath et al. and U.S. Pat. No. 4,528,047 to Beyer et al.

These techniques, while by and large producing good void free epitaxial monocrystalline silicon, nevertheless are very process sensitive, and tend to form an outer surface layer of the epitaxial silicon adjacent the dielectric side walls, which outer surface layers are prone to stacking fault defects. Even with careful process control, there can be a significant number of severity of defects which seriously limit the utility of such technology to VLSI structures. Proposals to reduce the amount and severity of various defects, such as by orienting the oxide layer and other process controls have been suggested, see e.g. article entitled "Advanced Dielectric Isolation through Selective Epitaxial Growth Techniques" by Borland et al. in Solid State Technology, August, 1985, pages 141-148. Also see H. Kitajima, et al., Proceeding of 5th International Symposium on Silicon Materials; Science and Technology, PV-86-4. Electrochem. Soc., editor H. R. Huff, Semiconductor Silicon/1986, p. 833-844; N. Miyamoto, et al., Japanese Journal of Applied Physics Part 1, Vol. 25, No. 12, December 1986, p. 1825-1829; N. Kasai, et al., Japanese Journal of Applied Physics, Vol. 26, No. 5, May, 1987, p. 671-674. While these do help to some extent, even these techniques still result in epitaxial silicon having defects or layers adjacent the dielectric side walls which bound the region in which they are grown, especially where orientation is changing. For example, in corners changes in orientation cannot be avoided and defects occur.

Hence the principal object of this invention is to provide a selectively grown epitaxial silicon crystal which has a low defect or defect free outer layer and a process which will form such a low defect or defect free outer layer to utilize regions for MOS FET's and bipolar devices.

SUMMARY OF THE INVENTION

According to the present invention, a low defect or defect free outer surface layer of epitaxial grown monocrystalline silicon at least in the critical regions is disclosed, and a method of forming the same is provided. According to this technique, a monocrystalline silicon substrate is provided on which the epitaxial silicon is to be grown, and which substrate is provided with a region bounded, at least in part, by dielectric side walls in which region the epitaxial silicon is to be grown. A silicon crystal is grown epitaxially in the region on the substrate. Following the crystal growth, at least a portion of the surface layer of the epitaxially grown crystals adjacent the dielectric material, which contains defects, is removed and replaced with a dielectric material. In one form the surface layer is replaced replaced by oxidizing this surface layer to form silicon dioxide. This is preferably accomplished by forming the dielectric layer as a composite oxide/nitride, and after formation removing the nitride layer by etching away the layer of nitride exposing the surface layer of epitaxially grown silicon so that it can be oxidized, with the oxidized silicon filling in the void left by the removal of the nitride layer. In another embodiment, a portion of the surface layer of the epitaxially grown silicon having the defects is removed, as by etching, and this void is filled by depositing additional dielectric material, such as silicon dioxide, or dielectric glasses therein.

DESCRIPTION OF THE PREFERRED EMBODIMENTS

Figures 1A, 1B:
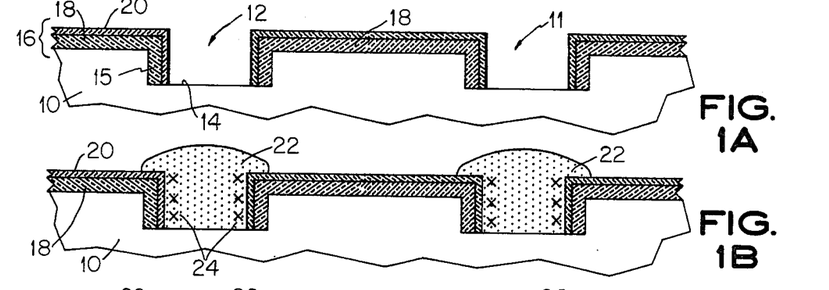
FIGS. 1A through 1H show somewhat schematically in step-wise fashion in cross-sectional view one embodiment of forming selectively grown epitaxial silicon crystals according to this invention.
Figure 1C:
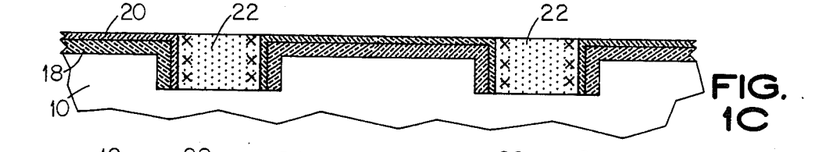

Referring now to the drawings, and for the present to FIGS. 1A through 1H, somewhat schematic representation of one embodiment for forming selective epitaxial silicon crystals having low defect is shown. This embodiment depicts the invention as it is practiced in what is known as employing selective epi trench (SET) techniques (see U.S. Pat. No. 4,526,631 supra). In FIG. 1A, a monocrystalline silicon substrate 10 is shown which has formed therein a plurality of trenches 12, two of which are shown, it being understood that typically a very large number of trenches are formed. The trenches are formed with bottom surfaces 14, and side walls 15, which are generally perpendicular to the bottom surface 14 although this need not be the case for this defect removal process since this could be applied to V-groove trenches as well (see U.S. Pat. No. 4,255,207 to Nicolay et al.). It should also be appreciated that trenches can also be of varying dimensions. The top of the substrate and the side walls 15 are covered with a dielectric insulating coating 16, which in this embodiment takes the form of a composite layer of an undercoating 18 of silicon dioxide ($SiO_2$) and an outer coating 20 of silicon nitride ($Si_3N_4$). The formation of this type of structure is well known in the art, and is described with specificity in U.S. Pat. No. 4,526,631; U.S Pat. No. 4,528,047, and references cited therein. Hence the details of forming this structure are not recited herein. These trenches may vary in size but typically may be 3 to 4 microns deep and about 1.7 microns wide, these dimensions being illustrative and not limiting. The thickness of the silicon dioxide may be about 1000 Å and the thickness of the silicon nitride is typically 1000 Å to 1500 Å, although the control of the silicon nitride thickness for this invention is of significance as will be described hereinafter.

The structure, as shown in FIG. 1A, is used as the starting point for growing selectively epitaxial signal crystals of silicon in each of the trenches. There are many techniques for growing such silicon crystals, the above cited references being referred to as well as the references cited therein, which teach such selective epitaxial growth of silicon crystals. Specifically one preferred technique for growing the epitaxial silicon crystals for this invention is given in U.S. Pat. No. 4,526,631. More specifically, the epitaxial refills are grown at 1000° C. at near atmospheric pressure using $SiCl_4$—$H_2$ with or without HCl. The epitaxial refills are deposited in an AMC 7800 reactor manufactured by Applied Materials, Santa Clara, Calif. $B_2H_6$ is employed as a dopant. The $SiCl_4$ input is 10.2 g/min. in a $H_2$ flow of 120 lpm (liters per minute). Fill level vs. time can be plotted for a number of cases, for the above conditions, with and without HCl. Spurious growth may be observed for the epitaxial refills where no HCl is employed whereas no spurious growth occurs for the refills wherein 0.6 l/min. HCl was employed. The trench is overfilled as shown in FIG. 1B. The selective growth process of the epitaxial silicon crystals uses the bottom wall 14 of the trench as a nucleation site to initiate growth, and the growth continues until the crystal 22 completely fills and slightly overfills prior to the polish step. This growth abuts tightly against the insulating wall 16 as shown in FIG. 1B. Each trench contains a single crystal of silicon, and depending upon the ultimate use to which each crystal is to be put, the required P or N dopants can be added to the epitaxial silicon as is well known in the art.

One of the problems encountered in growing the epitaxial silicon crystals in the confines of an insulating wall is that outer surface layer at the grown epitaxial crystal is very prone to certain types of defects. The defective layer 24 is indicated in FIGS. 1B through 1F with x's representing the defects such as stacking faults on the outer layer. The various defects can cause high leakage currents if active regions abut the sidewall interface.

There have been several proposals for controlling or limiting the amount and severity of these defects, such as for example growing the crystals in a preferential plane orientations within the insulators as the previous cited references have suggested. It has also been indicated that precleaning procedures can effect defect generation. H. Kurten, et al., IEEE trans. Electron Devices ED-30 (1983) 1511. However, none of these techniques either alone or taken together have solved the problem of defects in the outer surface of selective epitaxial silicon adjacent to the insulators.

The present process of this invention applies to all orientations and selective epitaxial configurations. First the epitaxial silicon 22 is planarized using chemical-mechanical polishing techniques as found in U.S. Pat. No. 4,528,047 to provide the structure shown in FIG. 1C. This technique employs a 3 weight percent $SiO_2$ slurry in the $H_2O$ adjusted to pH=11.8. The polishing is carried out at 16 psi for desired time. A polymeric polishing pad is used to press against the wafers during rotation being polished at the 16 psi causing the removal of elevated portions of the single crystal layer. The mechanism of the process is not fully understood, but it is believed that the surface of the single crystal silicon is hydrolyzed by the slurry and it is this softer material which is polished by the action of the slurry and the polishing pad. The nitride acts as a polishing stop. It should be understood other dry or wet etch back techniques such as RIE could be employed as well.

Figure 1D:
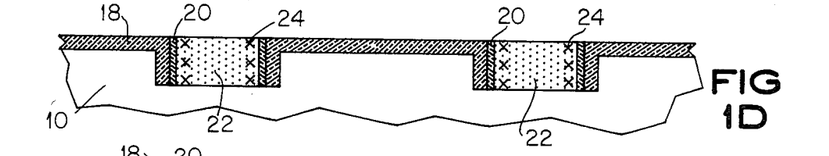
Figure 1E:
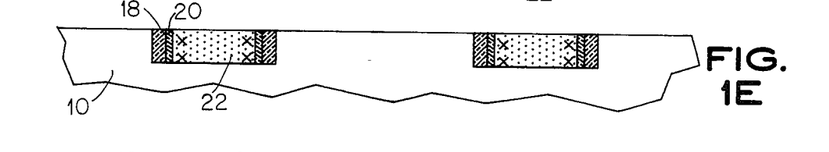

It should in addition be noted that one can planarize the surface so as to remove the top nitride surface as shown in FIG. 1D and the top oxide if desired. In this case, one would be left with nitride/oxide sidewalls only as shown in FIG. 1E. Planarization beyond the nitride stop layer is not critical to the process of defect removal described here since selective nitride etching can follow on either structure.

Figures 1F, 1G:
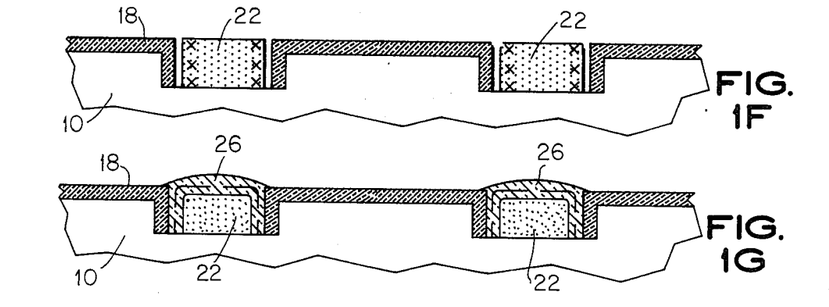

In order to remove the defects, the layer of silicon nitride is removed, preferably by etching in phosphoric acid, which will preferentially dissolve the silicon nitride, but will not significantly attack the silicon dioxide layer. The etching can take place, if desired, starting with the structure shown in FIG. 1C if only the epitaxial silicon is planarized, or the structure shown in FIG. 1D if the epitaxial silicon and top layer of nitride is planarized, or the structure shown in FIG. 1E if the epitaxial silicon, the top nitride and top silicon dioxide layer are planarized. FIG. 1F shows the resulting structure when the etch is performed starting with the structure of FIGS. 1C or 1D. The silicon nitride can be preferentially etched on the sidewall using phosphoric acid heated to 165° C. The etch rate on blanket nitride films is 50 Å/min. To etch away a nitride sidewall a higher etch rate is experienced. This rate can be 10 times the rate found on blanket films.

After the silicon nitride has been removed (as shown in FIG. 1F), the entire piece is subjected to an oxidizing treatment to oxidize the outer defect containing surface layers of the epitaxial crystals. Standard oxidation techniques can be employed to oxidize the outer defective layer. One such process is described in A. S. Grove, Physics and Technology of Semiconductor Devices, John Wiley & Sons, New York 1967, p. 22-34. However, any oxidation process or process-temperature sequence which allows the oxide being formed to flow viscoelastically would be suitable in preventing dislocations in the adjacent silicon. The oxidation of the outer surface converts the defect-containing layer of silicon to a layer of silicon dioxide 26 filling in the void around the epitaxial crystal and also on top, thus removing the layer of defective epitaxial silicon as shown in FIG. 1G. The space around the epitaxial crystal fills with silicon dioxide due to the fact that each unit volume of silicon oxidized produces approximately two unit volumes of silicon dioxide. Thus the oxidation is allowed to proceed until the space between the epitaxial crystal and the $SiO_2$ side wall is completely filled. The original surfaces of the epitaxial crystals are shown in broken lines in FIG. 1G, and, as can be seen, the defect-containing layer of epitaxial silicon has been completely converted to $SiO_2$. As indicated above, the thickness of the silicon nitride layer is of significance. This can readily be appreciated since when the void between the $SiO_2$ and epitaxial crystal is filled there is no more side surface epitaxial crystal exposed for oxidation, and hence oxidation of the side surface ceases. At this point, the oxidation has to have penetrated a sufficient depth to remove all of the defective layer. Since each unit volume of silicon oxidized results in two unit volumes of silicon dioxide, the thickness of the silicon nitride layer should be at least as thick as the thickness of the outer defect-containing layer of the epitaxial crystal to thus insure a sufficient depth of oxidation and hence removal of the defective layer. Since the layer containing the defects has been removed, or actually converted to $SiO_2$, a new outer surface 28 is created, which surface and underlying layer is essentially free of defects.

Figure 1H:
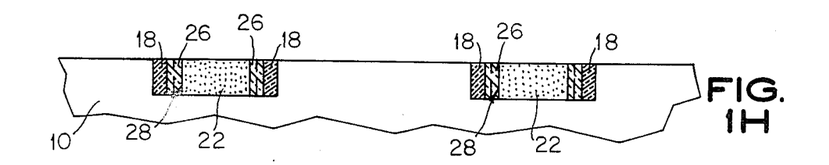

Following the oxidation, a conventional lithographic technique can be performed on the structure in FIG. 1G to open selected insulator areas to produce devices in the substrate silicon and the selectively grown silicon. Alternatively, the structure can be planarized as shown in FIG. 1H to expose a top surface 30 of the epitaxial silicon crystal. Thereafter processes such as oxidations, additional film depositions and diffusions and other commonly employed processes on silicon technology can be used to produce active and passive structures. There are many techniques for planarization which are well known in the art. A preferred technique is previously described chemical-mechanical planarization.

Referring now to FIGS. 2A through 2E, the invention is shown as practices in a slightly modified form from that of FIGS. 1A through 1B. In the previously described embodiment, the invention was practiced in selective epi trench (SET) isolation technique, and FIGS. 2A through 2E depict the invention in what is known commonly as selective epitaxial growth, and which technique is described in Borland et al. supra.

Figure 2A:
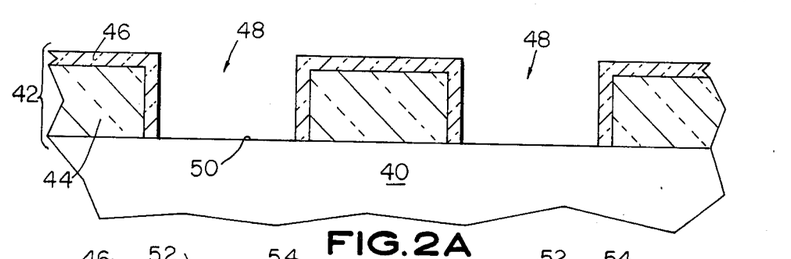
FIGS. 2A through 2E show somewhat schematically in step-wise fashion in cross-sectional view another embodiment of forming selectively grown epitaxial silicon crystals.

FIG. 2A shows a substrate of monocrystalline silicon 40, having disposed thereon a patterned layer 42 of an insulating material, the insulating material again is preferably a composite having an under layer 44 of silicon dioxide ($SiO_2$), and an over layer 46 of silicon nitride ($Si_3N_4$). The insulating layer is patterned so that there are a plurality of openings 48 extending down to the silicon substrate. The formation of this structure is well known in the art, e.g., see Borland et al. supra.

Figure 2B:
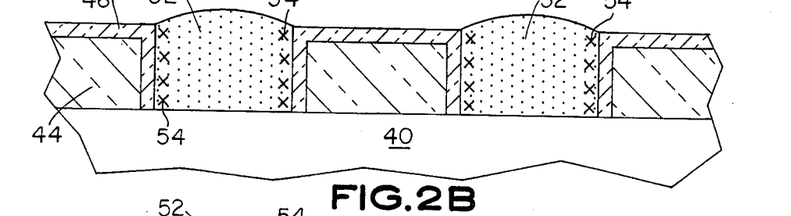
Figure 2C:
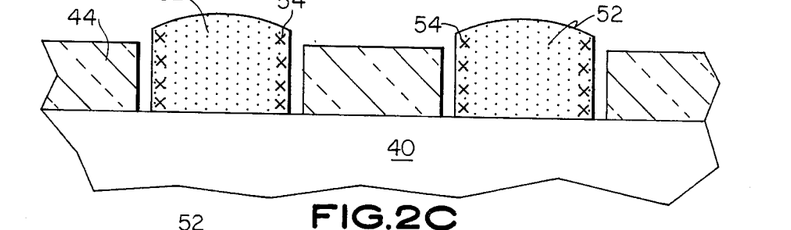
Figure 2D:
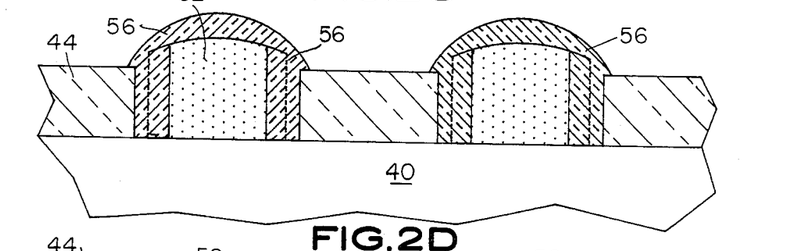
Figure 2E:
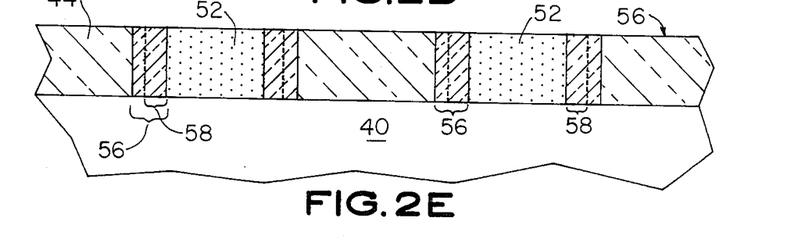

As in the previous embodiment, surface 50 of the substrate is used as a nucleating site to grow epitaxial silicon crystals as shown in FIG. 2B. Again the epitaxial crystals 52 are grown to completely fill the opening 48 and are slightly overgrown to extend slightly above the top of the opening. As in the previous embodiment, the outer layer 54 has defects represented by x's. Just as in the previous embodiment, the silicon nitride layer is etched away as shown in FIG. 2C by the previously described technique and an oxidizing treatment oxidizes the outer layer of the epitaxial crystal converting the defect-containing layer of silicon to a silicon dioxide coating 56, thus creating new outer surface 58 on the epitaxial crystal as shown in FIG. 2D. Conventional lithographic processes can be employed to form device structures. Planarization or etching can be alternatively used to expose the silicon surfaces for further processing as shown in FIG. 2E. A planarization process similar to that described for oxide in U.S. Pat. No. 4,526,631 to Silvestri et al. can be employed. In these two embodiments, it should be appreciated that the $Si_3N_4$ is being employed as an intervening film which can be selectively removed prior to the oxidation process for defect elimination. Alternative films which can be selectively removed may also be used, for example $Al_2O_3$ or glasses.

Figure 3A:
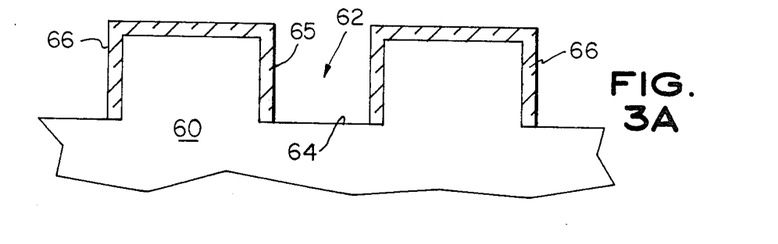
FIGS. 3A through 3I show somewhat schematically in step-wise fashion in cross-sectional view yet another embodiment of forming selectively grown epitaxial silicon crystals and in the final step an FET device formed therefrom.
Figure 3B:
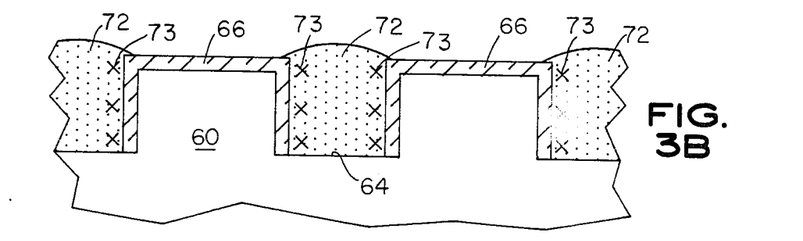
Figure 3C:
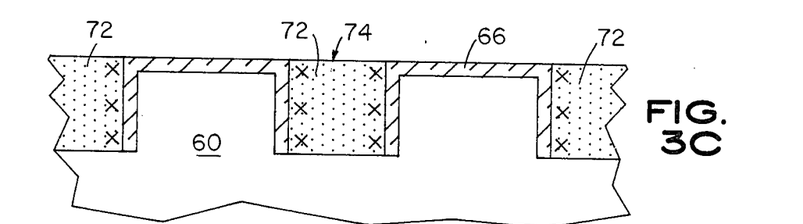

FIGS. 3A through 3G show a somewhat different technique for practicing this invention in an SET environment. FIG. 3A is similar to FIG. 1A as a starting point wherein a silicon monocrystalline substrate 60 is provided, having trenches or openings 62 formed therein, the trenches having side walls 65. The side walls 65, as well as the top of the substrate, are covered with an insulating coating 66. This layer can be a single layer if processing considerations allow this. A composite layer of e.g. silicon dioxide and silicon nitride is preferred if other process considerations such as planarization are required. As described previously, a crystal of silicon 72 is grown epitaxially using the bottom 64 of the opening 62 as a nucleating site. The epitaxial crystal is grown, as described in the previous embodiments, until it fills the opening 62 and extends just slightly above as shown in FIG. 3B and has an outer layer 73 containing defects designated by x's. The epitaxial silicon crystals 72 are planarized and polished such that the upper surfaces 74 are flush with the top of the oxide coating 66 as shown in FIG. 3C, as previously described.

Figure 3D:
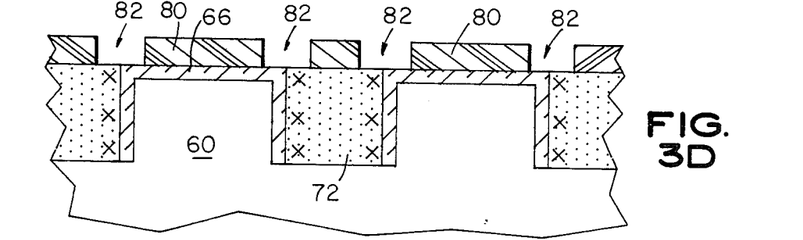
Figure 3E:
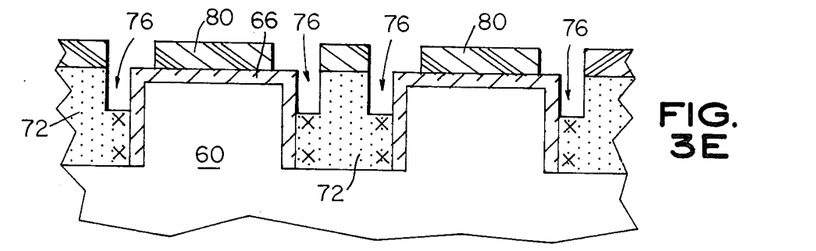
Figure 3F:
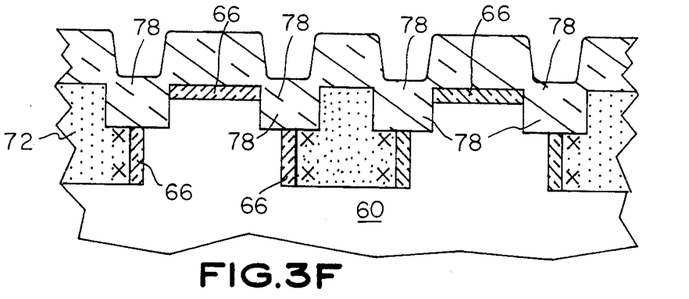
Figure 3G:
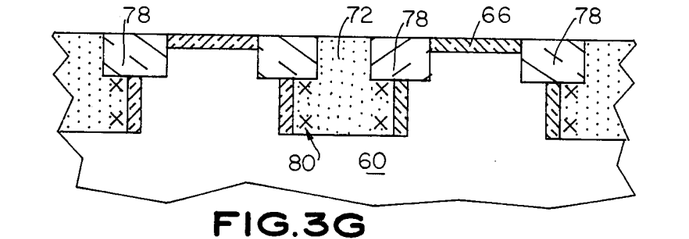

Following the planarization, a conventional photoresist mask 80 such as TNS or AZ (resists sold by Shipley Corp.) is formed with a pattern of openings 82 as shown in FIG. 3D. Reactive ion etching techniques using $SF_6/O_2$ will selectively etch regions 76 of the selective epitaxial growth as shown in FIG. 3E. The etch rate ratio of silicon to insulators should be 10-20:1 for the RIE process. Such techniques are described in M. Mieth et al., "Plasma Etching Using $SF_6$ on the Anisotropic Etching of Polysilicon," Semiconductor International, pp. 110-113, May 1986. An alternate process would employ a non-selective etch of the silicon regions as well as the dielectric sidewalls. This can be achieved with conventional RIE methods such as $CF_4/O_2$, such a technique is described in Mashiro Shibagari, et al., Japanese Journal of Applied Physics, Vol. 19 (1980), No. 8, pp. 1579-1580.

Figure 3H:
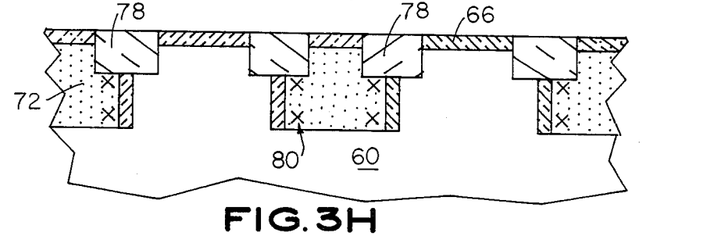
Figure 3I:
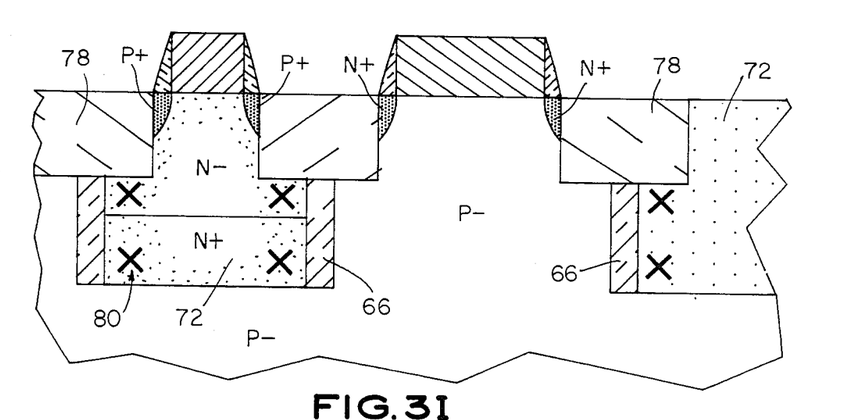

The end result is that the defective layer of selectively epitaxially grown silicon in the region just below the surface of the silicon substrate has been physically removed by RIE and this region can then be replaced with silicon dioxide 78 or other insulating material through CVD refill and using planarization techniques described earlier (FIGS. 3F and 3G). FIG. 3H shows the result of reoxidizing the selectively grown silicon crystal. Thus in this embodiment, only the very top part of the layer containing the defects on the epitaxially grown silicon is removed, while the remainder of the surface extending down the deeply extending insulator still contains defects. However, in most cases, this is a completely satisfactory solution since typically in both Bipolar and MOSFET technology only the upper portion of the epitaxially grown crystal is used for active devices and junction butting where the defective layer is detrimental and can cause leakage, the remainder being only required to be isolated primarily to prevent latch up in CMOS structures but without the necessity of having few or no defects in the upper surface region. This is illustrated in FIG. 3I, which shows how a selective epitaxially grown silicon crystal is utilized as a transistor in MOSFET technology. As can be seen, two P+ regions are formed on the surface of the epitaxially grown crystal. An N region lies beneath, but the active device extends no deeper than the shallow trench 76 filled with the dielectric material, and as explained above, the layer 80 containing defects which extends below the shallow trench will not adversely affect the operation of the device.

Figure 4:
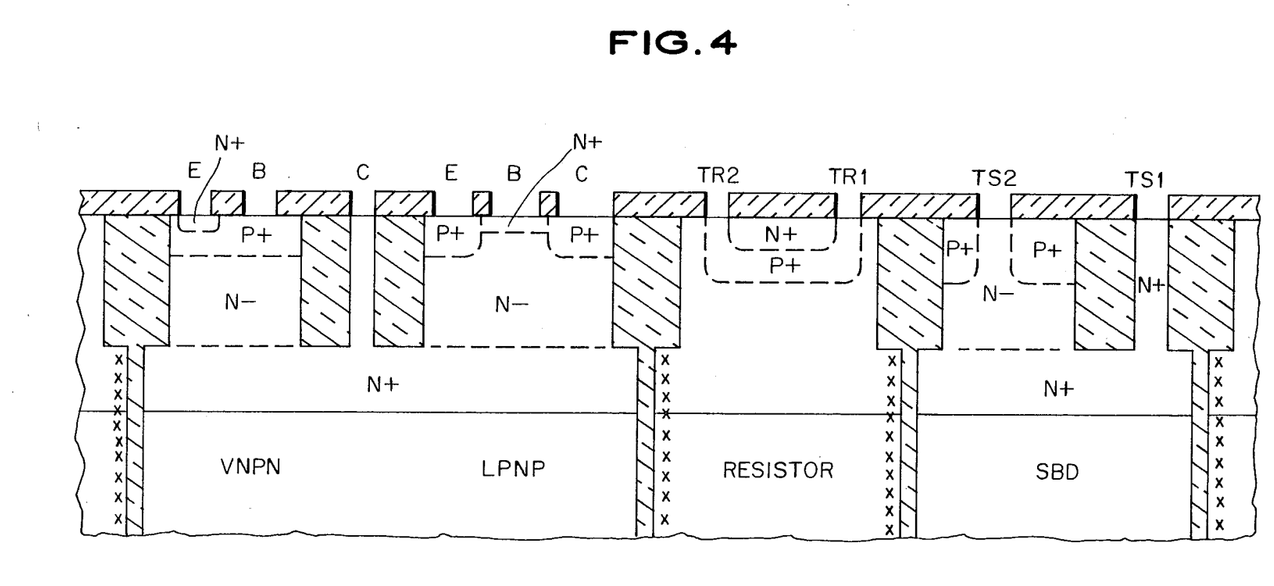
FIG. 4 shows bipolar device structures fashioned from a crystal produced according to this invention.

In a similar manner, bipolar devices also are formed such that their critical regions do not extend any deeper than the shallow trench. This is illustrated in FIG. 4. The devices shown from left to right are a vertical NPN transistor (VNPN), a lateral PNP transistor (LPNP), a resistor, and a Schottky barrier diode (SBD). The transistors each have an emitter E, a base B, and a collector C. The resistor has terminals TR1 and TR2, and the Schottky barrier diode has terminals TS1 and TS2.

While the invention has been described in considerable detail relating to several embodiments, these descriptions are illustrative, and not limiting, and various modifications can be made without departing from the scope of the invention.

What is claimed is:

1. A method of forming epitaxial monocrystalline silicon within a region isolated by insulating side walls, comprising the steps of:
    (a) providing a silicon substrate material having a region bounded at least in part by insulated side walls,
    (b) growing an epitaxial crystal of silicon within said region on said substrate, said epitaxial crystal being characterized by a defective surface layer at the interface of the epitaxial crystal and the insulated side walls, and
    (c) replacing at least a portion of said defective surface layer of said epitaxial crystal with an insulating material.

2. The invention as defined in claim 1, wherein said portion of said surface layer is replaced by oxidizing said portion with said surface layer to form silicon dioxide.

3. The invention as defined in claim 2, wherein said insulated side walls include at least two discrete coatings, and wherein the outer coating is selectively removed prior to oxidizing said portion of said surface layer and said oxidized silicon substantially fills the void left by the removal of said outer layer.

4. The invention as defined in claim 3, wherein the thickness of the outer coating is selected to be at least as thick as the surface layer of the epitaxial grown silicon crystal having defects.

5. The invention as defined in claim 3, wherein the outer coating is silicon nitride.

6. The invention as defined in claim 5, wherein the silicon nitride is removed by etching.

7. The invention as defined in claim 1, wherein said portion of said defective surface layer is removed leaving a void at the space occupied by said defective surface layer and additional insulating material is deposited in said void.

8. The invention as defined in claim 7, wherein the epitaxial silicon extends within a trench formed in said silicon substrate to a height at least as high as a face of said substrate, and wherein said insulated side walls surround said epitaxial silicon within said trench, further characterized by removing the defective surface layer of said epitaxial silicon in the region adjacent the face of said substrate to form a shallow trench and depositing said additional insulating material in the shallow trench where said defective surface layer has been removed.

9. The invention as defined in claim 8, wherein at least a portion of the insulation of said side wall is also removed and replaced with said additional insulating material.

10. The invention as defined in claim 9, wherein a portion of the silicon substrate surrounding the insulated side wall at the face thereof is also removed and replaced with said additional insulating material.

11. The invention as defined in claim 7, wherein said portion of said surface layer is removed by reactive ion etching.

12. The invention as defined in claim 1, wherein said insulated side walls are comprised of an insulating material deposited on the planar face of a silicon substrate, and having openings therein to said substrate.

13. A method of forming in a substrate a substantially defect-free epitaxial grown silicon crystal isolated by dielectric side walls, comprising:
  providing a semiconductor substrate having at least one deep trench having substantially vertical surfaces, said surfaces being covered with a composite dielectric layer of oxide over which a nitride layer is disposed;
  filling said trench with a silicon crystal by selective epitaxial growth on the substrate surfaces;
  selectively removing said nitride thereby forming a gap between said oxide and said crystal; and
  thermally oxidizing said crystal to completely fill said gap with oxide.

14. A method for forming in a substrate a substantially defect-free portion of an epitaxially grown silicon crystal isolated by insulator sidewalls, comprising:
  providing a semiconductor substrate having at least one deep trench having substantially vertical walls coated with an insulator liner;
  filling said trench with a silicon crystal by selective epitaxial growth on the substrate surface;
  forming shallow trenches over each of said walls and including the removal of a portion of the outer layer of the silicon crystal; and
  filling said shallow trenches with a dielectric.

15. A method of forming epitaxial monocrystalline semiconductor within a region isolated by insulating side walls, comprising the steps of:
  (a) providing a semiconductor substrate material having a region bounded at least in part by insulated side walls,
  (b) growing an epitaxial crystal of semiconductor within said region on said substrate, said epitaxial crystal being characterized by a defective surface layer at the interface of the epitaxial crystal and the insulated side walls, and
  (c) replacing at least a portion of said defective surface layer of said epitaxial crystal with an insulating material.

16. The invention as defined in claim 15, wherein said portion of said defective surface layer is removed leaving a void at the space occupied by said defective surface layer and additional insulating material is deposited in said void.

* * * * *